(12) United States Patent
Yeo et al.

(10) Patent No.: US 6,535,098 B1
(45) Date of Patent: Mar. 18, 2003

(54) INTEGRATED HELIX COIL INDUCTOR ON SILICON

(75) Inventors: Kiat Seng Yeo, Singapore (SG); Hai Peng Tan, Singapore (SG); Jian Guo Ma, Singapore (SG); Manh Anh Do, Singapore (SG); Kok Wai Johnny Chew, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/519,866

(22) Filed: Mar. 6, 2000

(51) Int. Cl.$^7$ .................................................. H01F 5/00
(52) U.S. Cl. ..................... 336/200; 336/83; 336/232
(58) Field of Search ........................ 336/83, 65, 200, 336/232; 29/602.1, 603.18, 603.13, 603.15

(56) References Cited

U.S. PATENT DOCUMENTS

| | | | |
|---|---|---|---|
| 3,614,554 A | 10/1971 | Shield et al. ............ 317/235 R |
| 5,576,680 A | 11/1996 | Ling ........................... 336/200 |
| 5,831,331 A | 11/1998 | Lee ............................ 257/659 |
| 5,884,990 A | 3/1999 | Burghartz et al. .......... 336/200 |
| 5,936,298 A | 8/1999 | Capocelli et al. ........... 257/531 |
| 6,008,102 A | 12/1999 | Alford et al. ................ 438/381 |
| 6,114,936 A * | 9/2000 | Yamamoto et al. ......... 336/192 |
| 6,281,778 B1 * | 8/2001 | El-sharawy et al. ........ 336/200 |

* cited by examiner

Primary Examiner—Lincoln Donovan
Assistant Examiner—Tuyen T. Nguyen
(74) Attorney, Agent, or Firm—George O. Saile; Rosemary L. S. Pike

(57) ABSTRACT

A new structure and method is provided for the creation of an inductor on the surface of a silicon semiconductor substrate. The inductor is of a helix coil design having upper level and lower level conductors further having an axis whereby the axis of the helix coil of the inductor is parallel to the plane of the underlying substrate. Under the first embodiment of the invention, the height of the helix coil that is created on the surface of a silicon substrate is uniform. Under the second embodiment of the invention the height of the helix coil of the inductor of the invention is uniform while a ferromagnetic core is inserted between the upper and the lower level conductors of the helix coil. Under the third embodiment of the invention, the height of the helix coil that is created on the surface of a silicon substrate is non-uniform. Under the fourth embodiment of the invention the height of the helix coil of the inductor of the invention is non-uniform while a ferromagnetic core is inserted between the upper and the lower level conductors of the helix coil.

17 Claims, 13 Drawing Sheets

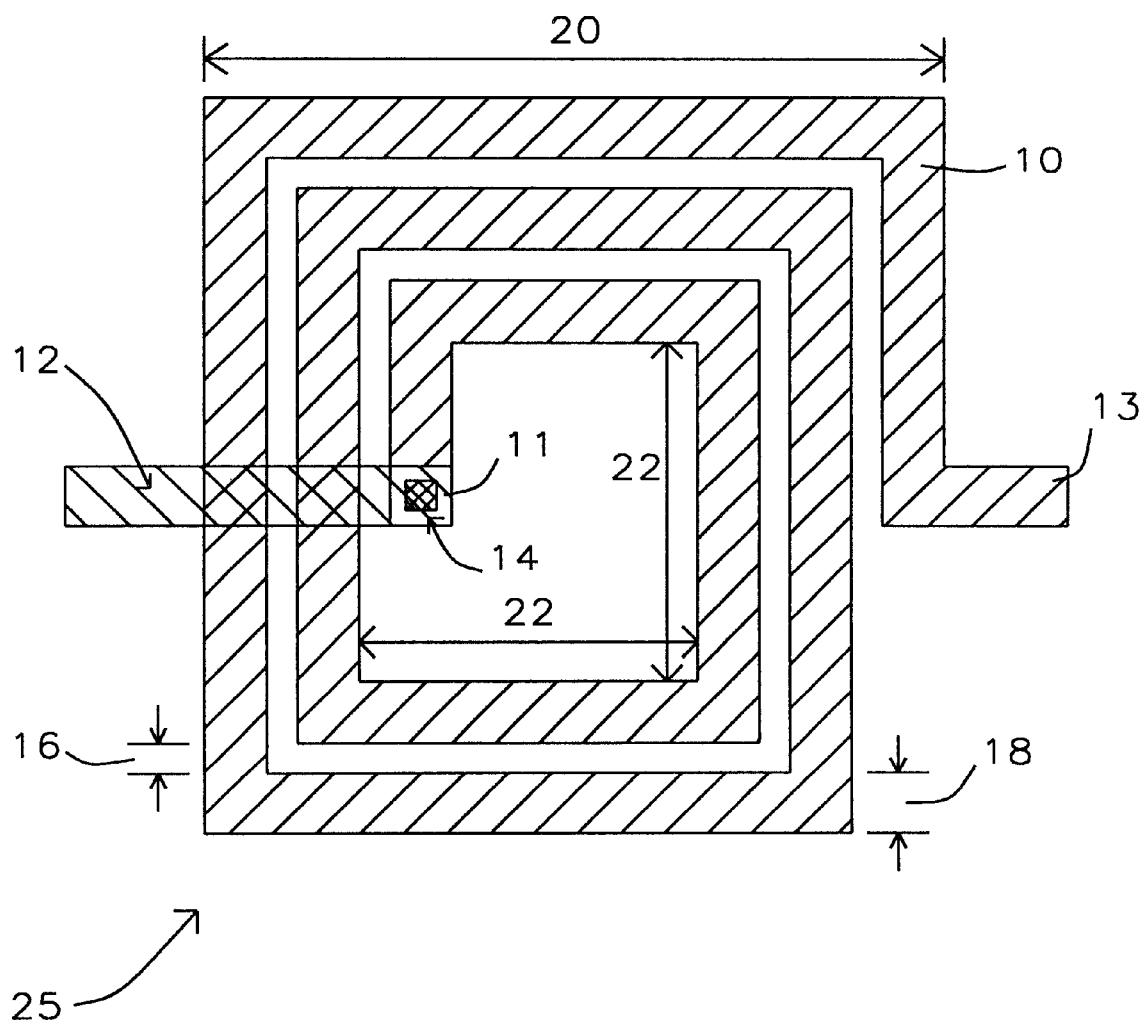
FIG. 1 – Prior Art

US 6,535,098 B1

INTEGRATED HELIX COIL INDUCTOR ON SILICON

BACKGROUND OF THE INVENTION (1) Field of the Invention

The invention relates to the fabrication of integrated circuit devices, and more particularly, to a method and structure for creating a high Q helix coil inductor that can readily be created for Complementary Metal Oxide Semiconductors (CMOS) for both Very Large Scale Integration (VLSI) and Ultra Large Scale Integration (ULSI) technologies.

(2) Description of the Prior Art

Modern semiconductor technology requires the creation of high performance semiconductor devices that are produced at competitive prices. A direct result of these requirements is that device density and inter-device packaging density continue to increase from which directly follows the requirement that the surface area or space that is available on the surface of a semiconductor substrate is carefully allocated and maximized in its use.

While the majority of semiconductor devices relate to the field of digital data processing, electronic circuitry can nevertheless be divided into two broad fields. One field addresses digital processing while the second field addresses the manipulation of analog signals. Digital semiconductor devices have as function the manipulation and storage of digital information. The functions of analog electronic circuitry have in previous years typically been handled by separate components such as relatively large capacitors or relatively large inductors. The separate components may have been applied in combination with digital processing capabilities, whereby however a significant portion of the functional implementation has been realized by the use of for instance capacitive and inductive components in addition to and functionally collaborating with the digital components. Circuit requirements that are imposed on components that are required for analog processing have in the past limited the integration of such components into typical semiconductor integrated circuit devices.

Modern mobile communication applications center around compact high-frequency equipment. With the continued improvements in the performance characteristics of this equipment, continued emphasis will be placed on small size of the equipment, low power consumption, increased frequency applications and low noise levels. Semiconductor devices are used in the field of mobile communication for the creation of Radio-Frequency (RF) amplifiers. A major component of a typical RF amplifier is a tuned circuit that contains inductive and capacitive components. The tuned circuit has as electrical characteristic that, dependent on and determined by the values of its inductive and capacitive components, can form an impedance that is frequency dependent, which enables the tuned circuit to either form a high or a low impedance for signals of a certain frequency. In this manner the tuned circuit can either reject or pass and further amplify components of an analog signal based on the frequency of that component. The tuned circuit can therefore be used as a filter to filter out or remove signals of certain frequencies or to remove noise from a circuit configuration that is aimed at manipulating analog signals. The tuned circuit can also be used to form a high electrical impedance by using the LC resonance of the circuit and to thereby counteract the effect of parasitic capacitances that are part of a circuit. The self-resonance that is caused by the parasitic capacitance between the (spiral) inductor and the underlying substrate will limit the use of the inductor at high frequencies.

One of the key components that is applied in creating high frequency analog semiconductor devices is the inductor that forms part of a LC resonance circuit. The key challenge in the creation of the inductor is to minimize the surface area that is required for the creation of the inductor while maintaining a high Q value for the inductor. Conventional inductors that are created on the surface of a substrate are of a spiral shape, whereby the spiral is created in a plane that is parallel with the plane of the surface of the substrate. Conventional methods that are used to create the inductor on the surface of a substrate suffer several limitations. Most high Q inductors form part of a hybrid device configuration or of Monolithic Microwave Integrated Circuits (MMIC's) or are created as discrete components, the creation of which is not readily integratable into a typical process of Integrated Circuit manufacturing.

By combining the creation on one semiconductor monolithic substrate of circuitry that is aimed at the function of analog data manipulation and analog data storage with the functions of digital data manipulation and digital data storage, a number of significant advantages are achieved. Such advantages include the reduction of manufacturing costs and the reduction of power consumption by the combined functions. To reach required inductive values for particular applications, inductors can be of significant physical size and can therefore require a significant surface area of the semiconductor substrate. To limit this impact of space requirement, inductors are typically formed on the surface of a substrate in a spiral form. The spiral form of the inductor however results in parasitic capacitances between the inductor wiring and the underlying substrate, due to the physical size of the inductor. These parasitic capacitances have a serious negative effect on the functionality of the created LC circuit by sharply reducing resonance frequency of the tuned circuit of the application.

Widely used in the industry to describe the applicability of a created inductor is the Quality (Q) factor of the inductor. The quality factor Q of an inductor is defined as follows: Q=Es/El wherein Es is the energy that is stored in the reactive portion of the component while El is the energy that is lost in the reactive portion of the component. The higher the quality of the component, the closer the resistive value of the component approaches zero while the Q factor of the component approaches infinity. The quality factor for components differs from the quality that is associated with filters or resonators. For components, the quality factor serves as a measure of the purity of the reactance (or the susceptance) of the component, which can be degraded due to parasitics. In an actual configuration, there are always some physical resistors that will dissipate power, thereby decreasing the power that can be recovered. The quality factor Q is dimensionless. A Q value of greater than 100 is considered very high for discrete inductors that are mounted on the surface of Printed Circuit Boards. For inductors that form part of an integrated circuit, the Q value is typically in the range between about 3 and 10.

In creating an inductor on a monolithic substrate on which additional semiconductor devices are created, the parasitic capacitances that occur as part of this creation limit to less than 5 the quality factor that can be achieved for the inductor using the conventional silicon process. This limitation is, for many applications, not acceptable. Dependent on the frequency at which the LC circuit is designed to resonate, significantly larger values of quality factor, such as for instance 100 or more, must be available. Prior Art has in this been limited to creating values of higher quality factors as separate units, and in integrating these separate units with the surrounding device functions. This negates the advantages that can be obtained when using the monolithic construction of creating both the inductor and the surrounding devices on one and the same semiconductor substrate. The non-monolithic approach also has the disadvantage that additional wiring is required to interconnect the subcomponents of the assembly, thereby again introducing additional parasitic capacitances and resistive losses over the interconnecting wiring network. For many of the applications of the RF amplifier, such as portable battery powered applications, power consumption is at a premium and must therefore be as low as possible. By raising the power consumption, the effects of parasitic capacitances and resistive power loss can be partially compensated but there are limitations to even this approach. These problems take on even greater urgency with the rapid expansion of wireless applications such as portable telephones and the like. Wireless communications is a rapidly expanding market, where the integration of RF integrated circuits is one of the most important challenges. One of the approaches is to significantly increase the frequency of operation to for instance the range of 10 to 100 GHz. For such high frequencies, the values of the quality factor obtained from silicon-based inductors are significantly degraded. For applications in this frequency range, monolithic inductors have been researched using other than silicon as the base for the creation of the inductors. Such monolithic inductors have for instance been created using sapphire or GaAs as a base. These inductors have a considerably lower parasitic capacitance than their silicon counterparts and therefore provide higher resonance frequency of the LC circuit. Where however more complex applications are required, the need still exists to create inductors using silicon as a substrate. For those applications, the approach of using a base material other than silicon has proven to be too cumbersome while for instance GaAs as a medium for the creation of semiconductor devices is as yet a technical challenge that needs to be addressed.

The incorporation of RF inductors without sacrificing device performance due to substrate losses has been extensively researched in recent years. Some of the techniques that have been used for this approach include:

the selective removing (by etching) of the silicon underneath the inductor (using methods of micro-machining) thereby removing substrate parasitic effects using multiple layers of metal (such as aluminum) interconnects or of copper damascene interconnects using a high resistivity silicon substrate thereby reducing resistive losses in the silicon substrate, since resistive substrate losses form a dominant factor in determining the Q value of silicon inductors using metals that are particularly adaptable to the process of the formation of inductors, a concern is thereby however raised by the use of AlCu (a metal that is frequently used in semiconductor metallization) since AlCu has higher resistivity than gold (Au) metallization that is frequently-used in GaAs technology.

employing biased wells underneath a spiral conductor inserting various types of patterned ground shields between the spiral inductor and the silicon substrate, and creating an active inductive component that simulates the electrical properties of an inductor as it is applied in active circuitry; this approach however results in high power consumption by the inductor and in noise performance that is unacceptable for low power, high frequency applications.

The above listing of researched alternatives is not meant to be complete or all inconclusive. The above approaches have as common objectives to:

1) enhance the quality (Q) value of the inductor
2) increase the frequency of the LC self-resonance thereby increasing the frequency range over which the inductor can be used, and
3) reduce the surface area that is required for the creation of the inductor.

The inductor of the invention addresses the objectives that have been listed above and provides a method for creating an inductor that can readily be integrated in a manufacturing process for the creation of VLSI and ULSI CMOS devices. The method of the invention creates a helix coil inductor, which has an improved Q factor when compared with the Q factor of a typical spiral inductor, that is created in a plane that is parallel with the surface of the substrate.

FIG. 1a shows a top view of a Prior Art horizontal spiral inductor 25. Some of the design parameters of conductor 25 are highlighted as follows:

10 is the body of the inductor and contains a conductive material 11 is one extremity of the conductive body 10 of the inductor 25 and is, for convenience sake and arbitrarily, referred to as the beginning of the conductive body 10 of the inductor 25

12 is a conductive connector that connects to the beginning 11 of the conductive body 10 of the inductor 25

13 is the opposing extremity of the conductive body 10 of the inductor 25 and will be referred to as the end of the conductive body of the inductor 25

14 is a contact-via that interconnects metal strip 12 with the conductive body 10 of the inductor 25

16 is the spacing between the spirals of the conductive body 10 of inductor 25

18 is the width of the spirals of the conductive body 10 of inductor 25

20 is the length of the longest spiral of the conductive body 10 of inductor 25, and 22 is the length of the inner opening of the conductive body 10 of inductor 25.

The top view of the Prior Art inductor that is shown in FIG. 1 is not shown in order to highlight in extensive detail all the parameters that can be associated with such an inductor but merely serves to point out the essence of the Prior Art inductor, that is:

the geometric shape of the inductor is that of a spiral the individual sections that make up the spiral of the inductor alternately intersect at an angle of 90 degrees and have a length and a width and are separated by a spacing the spiral that forms the inductor ends in two extremities, the inductor is electrically interconnected to surrounding circuitry by being connected to these two extremities, and the body of the inductor is contained in a plane that is parallel to the plane of the surface of the substrate on which the inductor is created.

Not shown in FIG. 1 is the height of each of the linear segments that collectively form the body of the inductor 10, this height can be defined as the thickness of the conductive layer that is deposited on the surface of the substrate for the formation of the inductor. The lower surface of the inductor is the surface of the inductor that is parallel to the surface of the substrate and that is closest to the surface of the substrate, the upper surface of the inductor is the surface of the inductor that is parallel to the surface of the substrate and that is furthest removed from the surface of the substrate. The distance between the upper surface and the lower surface of the inductor as measured in a direction that is perpendicular to the plane of the substrate is the height of the inductor. A cross section of the inductor that is taken in a plane between the upper and the lower surface of the inductor shows the geometric shape of the inductor, which is the shape of a spiral. The height of the inductor of Prior Art is essentially the same along the spiral of the inductor.

U.S. Pat. No. 5,936,298 (Capocelli) teaches a Helix coil. The patent does not appear to claim a wider center radius.

U.S. Pat. No. 5,576,680 (Ling) shows helix coil with a core.

U.S. Pat. No. 5,884,990 (Burghartz et al.), U.S. Pat. No. 6,008,102 (Alford et al.), U.S. Pat. No. 5,831,331 (Lee) and U.S. Pat. No. 3,614,5,54 (Shield) show various coils helix coils and cores.

SUMMARY OF THE INVENTION

A principle objective of the invention is to create an inductor on the surface of a silicon substrate that has improved Q factor when compared with the spiral inductor of conventional design.

Another objective of the invention is to create an inductor on the surface of a silicon substrate that provides higher inductive values when compared with the spiral inductor of conventional design.

Another objective of the invention is to create an inductor on the surface of a silicon substrate that requires a smaller silicon surface area for its implementation when compared with the spiral inductor of conventional design.

Another objective of the invention is to create an inductor on the surface of a silicon substrate that extends and maintains its characteristics of improved Q factor and higher inductive values and a smaller silicon surface area for its implementation in higher frequency applications when compared with the spiral inductor of conventional design in higher frequency applications.

In accordance with the objectives of the invention a new structure is provided for the creation of an inductor on the surface of a silicon semiconductor substrate. The inductor is of helix coil, whereby the plane of a cross section of the inductor that reflects the helix coil design of the inductor is parallel to the plane of the underlying substrate. Under the first embodiment of the invention, the height of the helix coil that is created on the surface of a silicon substrate is uniform. Under the second embodiment of the invention the height of the helix coil of the inductor of the invention is also uniform but a ferromagnetic core is inserted between the upper and the lower conductors of the helix coil. Under the third embodiment of the invention, the height of the helix coil that is created on the surface of a silicon substrate is non-uniform. Under the fourth embodiment of the invention the height of the helix coil of the inductor of the invention is non-uniform while a ferromagnetic core is inserted between the upper and the lower conductors of the helix coil.

BRIEF DESCRIPTION OF THE DRAWINGS

FIG. 1 shows a top view of a Prior Art horizontal spiral conductor.

DESCRIPTION OF THE PREFERRED EMBODIMENTS

Figure 2A:
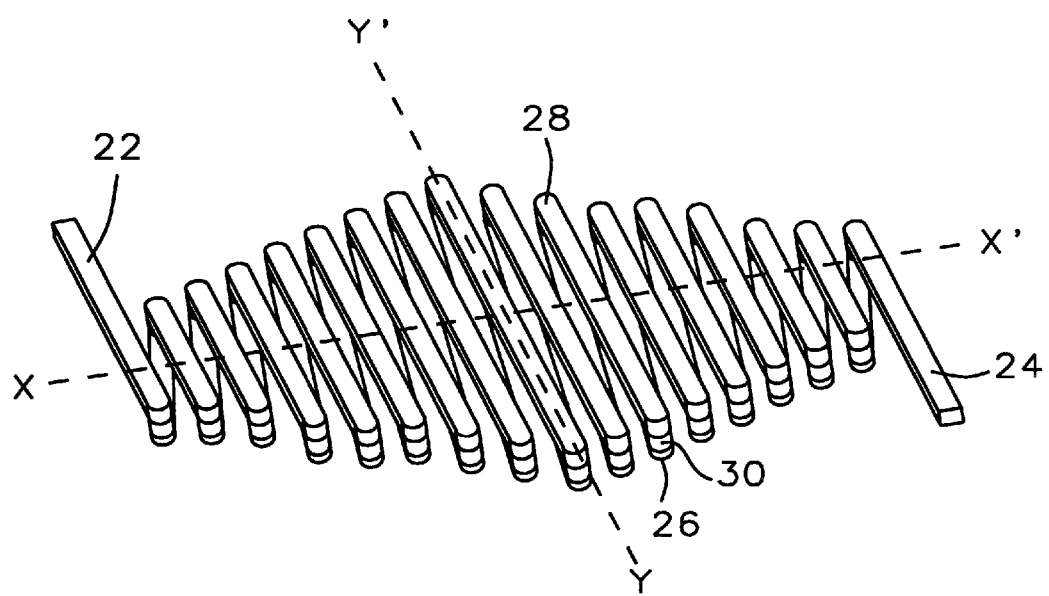
FIG. 2a is an extended three-dimensional view of the helix coil inductor of the invention with a uniform vertical interconnect conductor height.

The structure of the invention will be highlighted by concentrating on the geometric and structural details of the creation of the inductor of the invention. Processing conditions that are required to implement these structural details will not be highlighted for reasons of simplicity. Among these processing steps are steps of depositing layers of dielectric and the patterning and etching of openings in these layers of dielectric whereby these openings are aligned with underlying patterns. To include these processing steps in the description of the inventions would require the entry of conditions of deposition, patterning and etching that would make the current document unnecessarily cumbersome.

The key concept and key reason that causes the design of helix coil inductor to provide significantly improved performance as an inductor, improvements that have already been highlighted under the objective of the invention, will be indicated following. In the conventional design of an inductor that is created on the surface of a silicon substrate, a design that is presented in FIG. 1, the electromagnetic field of the inductor penetrates the surface of the underlying silicon substrate due to its location and construction. This penetration of the magnetic field of the inductor into the underlying silicon substrate causes significant resistive losses that restrict or reduce the Q value that can be obtained for the inductor of conventional design. The design of the invention, which uses a helix coil for geometry for the body of the inductor, provides an inductor that has a wider coil radius at the center of the coil which maximizes the intensity of the electromagnetic field in that area. In addition, the electromagnetic field of the invention is essentially horizontal and above the surface of the substrate, which significantly reduced the resistive losses that are incurred by the inductor in the surface of the inductor. The increased strength of the electromagnetic field at the center of the body of the inductor combined with the horizontal orientation of the electromagnetic field of the inductor leads to increased inductive value of the component and increased Q value of the inductor.

In view of the above, and considering that current trends in the semiconductor industry are gravitating towards increased use of high-performance broadband RF applications combined with the convergence of computer, consumer and communication based technologies, it is expected that the inductor of the invention will exert a significant influence on current broadband designs and applications. In addition, for the era of deep-submicron processes combined with the use of copper for interconnect lines, the inductor of the invention provides for significant improvements in the Q factor of the inductor while higher inductive values can be obtained at reduced surface areas that are required for the creation of the inductor, all these advances and advantages remaining valid at high frequencies of applications.

FIG. 2 addresses a helix coil inductor of the first embodiment of the invention that uses uniform conductor height, as follow:

FIG. 2a is an extended three-dimensional view of the helix coil inductor of the invention with a uniform conductor height.

In order to facilitate the following discussions, the familiar concept of three-dimensional Cartesian coordinates is briefly discussed with an emphasis on how these coordinates will be used for the subject discussion. The Cartesian coordinates as used herein have three axis, the X, Y and Z axis whereby the angle between each of the three axis and the other two axis is 90 degrees. The X and Y axis are in a plane that is parallel with the surface of the substrate on which the inductor will be formed, the Z axis is therefore perpendicular to the plane of the substrate. The three axis of the Cartesian coordinates intersect in one point, which is considered the geometric center of the Cartesian coordinates.

Referring now specifically to FIG. 2a, there is shown a three dimensional expanded view of the helix coil inductor of the invention whereby the height of the inductor is uniform in a plane that is parallel to the plane of the surface of the substrate on which the inductor is created. The helix coil of the inductor has bottom level conductors and upper level conductors, both the bottom level conductors and the upper level conductors run parallel to the plane of the surface of the underlying silicon substrate. The lower level conductors are connected to the upper level conductors by means of conductor interconnects that run in the Z direction of the helix inductor. The helix coil of the inductor of the invention has a lower surface and an upper surface. The lower surface of the helix coil is the surface of the helix coil that is closest to the surface of the underlying substrate whereby the lower surface of the helix coil coincides with the lower surface of the lower level conductors of the helix coil. The upper surface of the helix coil is the surface of the helix coil that is furthest removed from the surface of the underlying substrate whereby the upper surface of the helix coil coincides with the upper surface of the upper conductors of the helix coil.

The Cartesian X and Y coordinates are indicated in FIG. 2a, the third coordinate Z is perpendicular to the plane that contains the X and Y axis whereby the latter plane is parallel to the plane of the surface of the substrate. It is clear from the three dimensional view that is shown in FIG. 2a, that the helix coil is widest at the center of the conductor along the Y-axis and at the point where the X and Y-axis intersect. From this point of maximum width and proceeding in either direction along the X-axis, the Y parameter of the maximum extension of the successive upper and lower level conductors that form the helix coil have progressively smaller values. It is further clear that the upper conductors of the helix coil intersect the X-axis under an angle that is 90 degrees while the lower level conductors intersect the X-axis under an angle that is not 90 degrees but have an angle of intersect with the X-axis without which a helix coil cannot be a helix coil. One further observation is in order relative to the perspective view of the helix coil that is shown in FIG. 2a: the height of the vertical interconnects between the upper and the lower level conductors of the helix coil is uniform. It is important to highlight this at this time because one of the embodiments of the invention provides a design where this is not the case.

In FIG. 2a, one of the upper conductors has been highlighted as conductor 28, one of the lower level inductors has been highlighted as inductor 26, one vertical conductor interconnect has been highlighted as 30 while the two input/output connectors to the helix coil of the inductor have been highlighted as 22 and 24. It is further clear from the view of the helix coil of the invention that the upper level (28) and lower level (26) conductors have a cross section that is a geometric rectangle while the vertical interconnect conductors (30) have a cross section that is a circle.

A helix coil typically has an axis, the axis of the helix coil that is shown in FIG. 2a is parallel with the plane of the underlying semiconductor substrate (not shown in FIG. 1) and runs parallel with the X–X' axis. This axis of the helix coil will typically run through the middle of the coil in the direction X–X' shown in FIG. 2a and in a plane that contains the X–X' axis and is perpendicular to the surface of the underlying substrate and between the upper conductors and the lower conductors at a height above the upper surface of the lower level conductors that is equal to half the height of the vertical interconnect conductors.

The process of creating the helix coil conductor of the invention uses the following steps. The lower level conductors 26 are first formed, these conductors may be formed on top of a layer of dielectric that has been deposited on the surface of the underlying substrate or they may be formed directly on the surface of the substrate. These lower level conductors 26 are formed under a relatively small angle with the Y–Y! axis, an angel of between about 5 and 30 degrees. After the lower level conductors have been formed, dielectric is deposited over the surface of the lower level of conductors to a height that is the combined value of the height of the vertical interconnects 30 and the thickness of the upper level conductors 28. The conventional dual damascene process then allows for the creation of the vertical interconnects 30 at the same time that the upper level of conductors 28 are created. After this dual damascene process has been completed, the now completed helix coil of the invention can be covered with a passivation layer to protect the coil from environmentally induced damage. In performing the dual damascene process, it must be noted that the input and output connections. 22/24 for the helix coil are to be simultaneously created thus providing the means of accessing the helix coil.

Figure 2B:
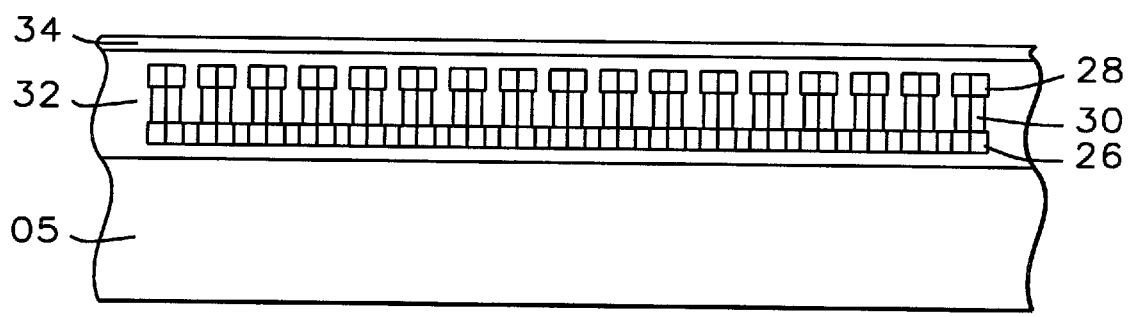
FIG. 2b shows an X–X' cross section of the helix coil inductor of the invention with a uniform vertical interconnect conductor height.

Proceeding to FIG. 2b, there is shown an X–X' cross section of the helix coil inductor of the invention with a uniform conductor height. The cross section that is shown in FIG. 2b is taken along the X–X' axis (as if sawing the coil in half along the line of the X-axis that is shown in FIG. 2a and looking at one or the other of the sawed off surfaces) and therefore does not indicate the variation in lengths that exists between successive and adjacent upper and lower level conductors that form the helix coil of the inductor.

Highlighted in FIG. 2b is one of the upper level conductors 28, one of the lower level conductors 26 and one of the vertical interconnects 30 between the upper and lower level conductors. It is understood in FIG. 2b that all cross sections of identical geometry that are shown at the same level as cross section 28 are (the other) upper conductors, correspondingly for the lower level conductors 26 and the vertical interconnects 30 of the helix coil.

Further shown in the cross section that is shown in FIG. 2b is the silicon substrate 05 on the surface of which the helix coil of the invention is created. The helix coil of the invention is created in a layer 32 of dielectric that can contain for instance oxide. Over the surface of layer 32 of dielectric a passivation layer 34 is deposited for the protection and shielding of the helix coil of the invention.

Figure 2C:
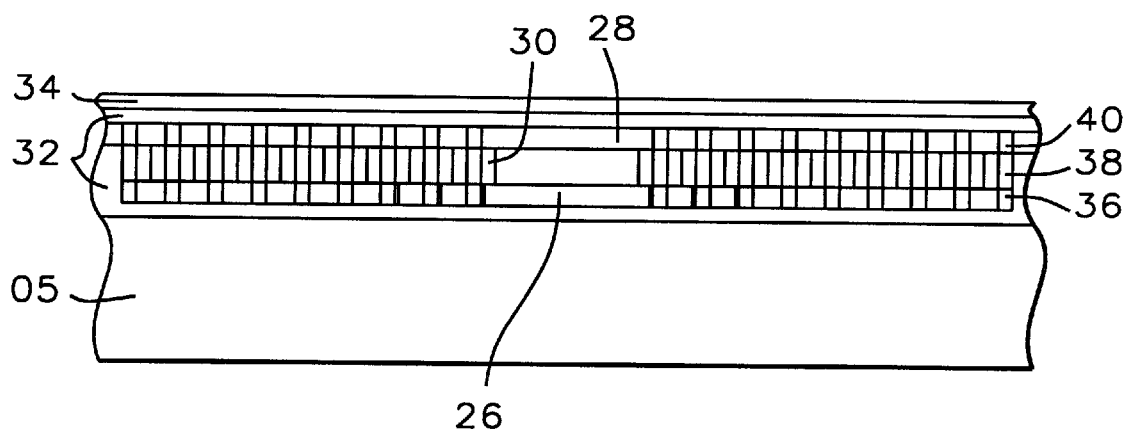
FIG. 2c shows an Y–Y' cross section of the helix coil inductor of the invention with a uniform vertical interconnect conductor height.

FIG. 2c shows an Y–Y' cross section of the helix coil inductor of the invention with a uniform conductor height. The previously identified upper and lower level conductors of the helix coil are highlighted in FIG. 2c together with one vertical interconnect between the lower and the upper level conductors. Further highlighted are items 36, 38 and 40, which represent respectively the collective ends of the lower level conductors 26, the collective vertical interconnects 30 and the collective ends of the upper conductors 28 of the helix coil when looking at this coil from the Y–Y' cross cut. For reasons of simplicity these collective items have been highlighted only once whereby it is understood that the totality of 36, 38 and 40 is represented by equal cross sections that are shown in FIG. 2c of the same geometric configuration and at the same (horizontal) level as where 36, 38 and 40 have been highlighted.

Figure 2D:
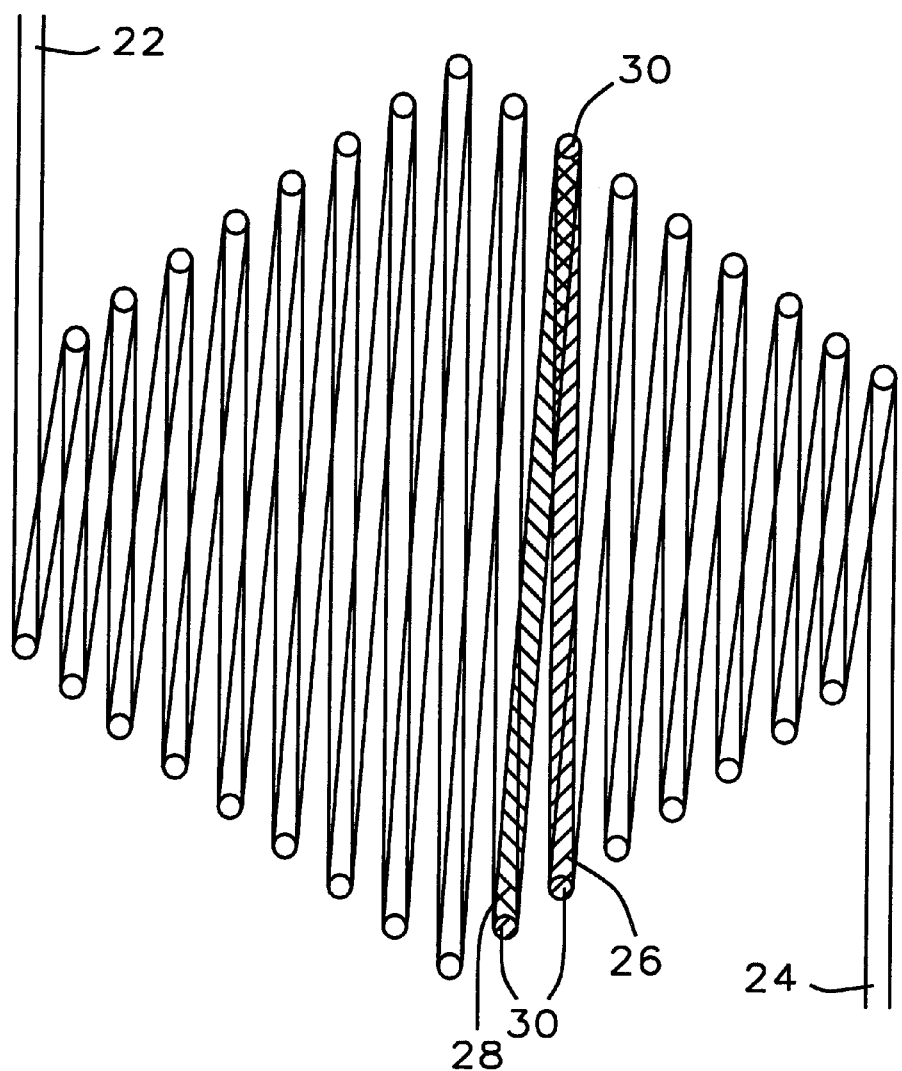
FIG. 2d shows a top view of the helix coil inductor of the invention with a uniform vertical interconnect conductor height.

FIG. 2d shows a top view of the helix coil inductor of the invention with a uniform conductor height. In FIG. 2d only one upper conductor (28) and one lower level conductor (26) have been cross hatched (limited to only one for reasons of clarity of the top view that is shown), three vertical interconnects 30 that interconnect the highlighted upper and the lower level conductors (to each other) and to the immediately adjacent conductors have also been highlighted.

Figure 2E:
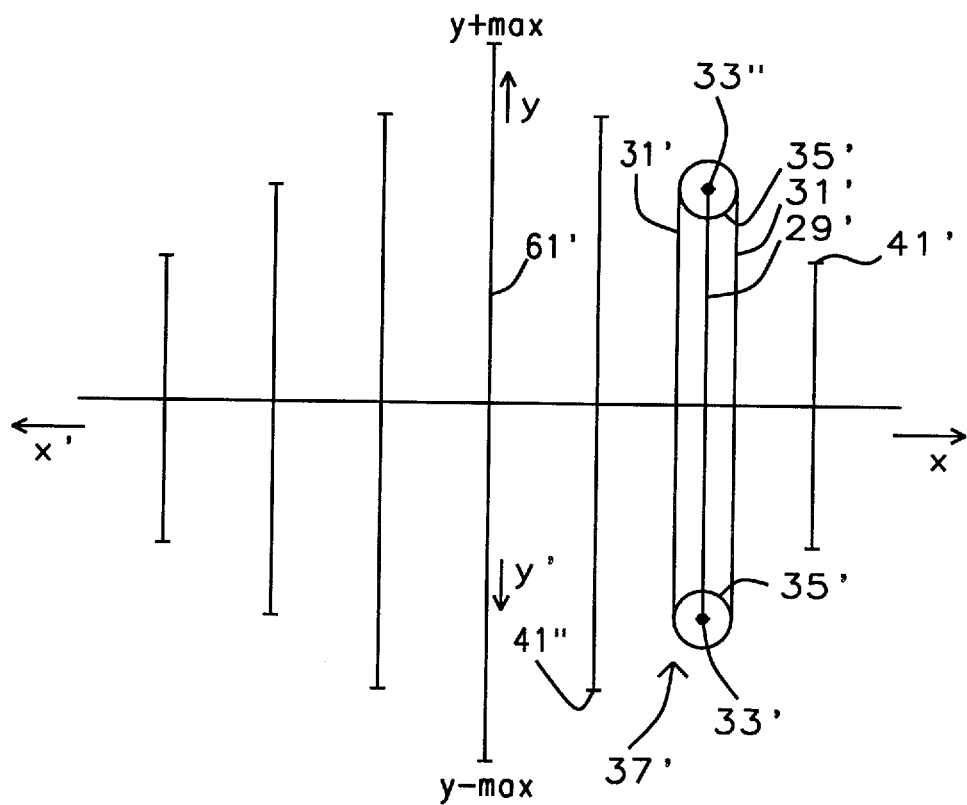
FIG. 2e shows a top view of the geometric centers of a sampling of top level conductors of the helix coil of the invention.
Figure 2F:
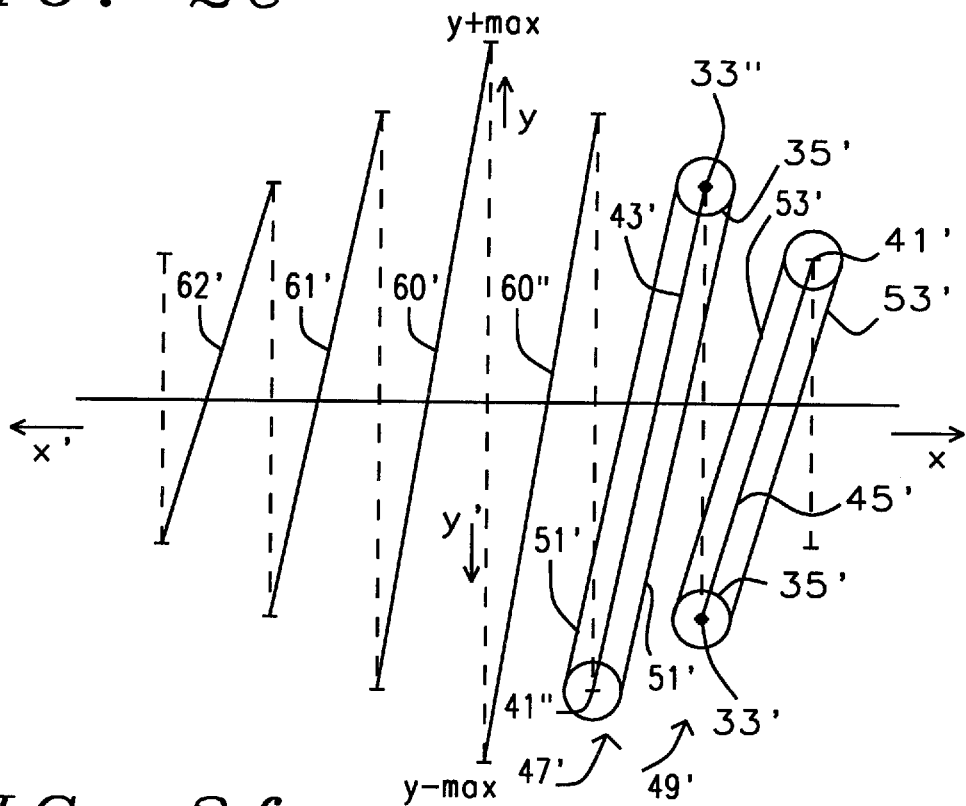
FIG. 2f shows a top view of the geometric centers of a sampling of bottom level conductors of the helix coil of the invention.

The graphic displays that are shown in FIGS. 2e and 2f are presented to facilitate later explanations of the structure of the helix coil of the invention. The lines shown in each of these two figures are imaginary center lines that are defined as existing between the sidewalls of the upper level and lower level conductors and that run in the direction of length of these conductors. As such it is convenient to refer to these lines as the lengthwise geometric center lines or simply the geometric centers of the conductors. These geometric center lines can exist in either the upper of the lower surface of either the upper level or lower level conductors of the helix coil of the invention. It is thereby preferred to refer to the geometric center of the lower surface of an upper level conductor and the geometric center of the upper surface of a lower level conductor. The reason for this is that these two surfaces face each other and that the vertical interconnect make contact with these surfaces.

FIG. 2e shows a top view of the geometric centers of a sampling of top level conductors 28 of the helix coil of the invention. It is noteworthy that the geometric centers of the upper level conductors intersect the X–X' axis under an angle of 90 degrees, that the longest of the upper level conductors, that is line 61' has a point y+ max. and a point y– max. These points are the points where the geometric center of the vertical interconnect conductors 30 overlays respectively the lower surface of the upper level conductor (28) and the upper surface of the lower level conductor (26). Since the cross section of the vertical interconnect conductor is a circle, the geometric center of the cross section of the vertical interconnect conductors is the line that connects two geometric centers of two different cross sections of a vertical interconnect conductor. Further to be noted from FIG. 2e is that the geometric centers of the upper level conductors are parallel, that the upper level conductors are of reduced length for conductors that are further removed from the longest upper level conductor and that the upper level conductors extend from their intersect with the X–X' axis over equal length at both sides of this intersect.

To specifically highlight some of the design aspects of the helix coil, further detail has been shown for one selected upper level conductor 37'. The line 29' as shown represents the geometric center of the upper level conductor 37', with end points 33' and 33". The circular cross sections of the vertical interconnects that make contact with the lower surface of the upper level conductor 37' are highlighted as the circles 35', the center of these circles 35' is the geometric center of the vertical interconnects while 31' are the two lines that represent the sidewalls of the upper level conductor 37'. The points 41' and 41" are endpoints of geometric centers of lines that are adjacent to line 37' that are used in the description under FIG. 2f.

FIG. 2f shows a top view of the geometric centers of a sampling of bottom level conductors of the helix coil of the invention. The lower level conductors contain two conductors 60' and 60" of maximum length whose geometric centers intersect the Y–Y' axis at the two points y+ max. and y– max. These latter two points are the two points where the vertical interconnects for these lower level conductors 60' and 60" are the same vertical interconnect as the vertical interconnects that are connected to the maximum length upper level conductor 61'. These two points are, in other words, the two points where the maximum width of the upper level conductors matches up with the maximum width of the lower level conductors. Further noteworthy in FIG. 2f is that the lower level conductors are not parallel and intersect the X–X' axis under an angle that is not constant, that the lower level conductors are of reduced lengths for conductors that are further removed from the two longest lower level conductors 60' and 60" and that the lower level conductors extend from their intersect with the X–X' axis over a distance that is not equal in length at both sides of this intersect. The angle between the direction of the Y–Y' axis and the-direction of the lower level conductors is the same for the lowest level conductors 60' and 60" maximum and equal length, this angle increases for lines of geometric centers that are further removed from these lines of geometric centers 60' and 60". For pairs of lines of geometric centers that surround lines 60 and 60", these angles are the same, for instance for lines 43' and 61', the angle between the direction of this line and the direction of the Y–Y' axis is the same, as is the case for lines 62' and 45'.

Further shown in FIG. 2f are two lower level conductors 47' and 49' that interconnect with the upper level conductor 37' of FIG. 2e. This is highlighted by making the end points of the geometric centers 43' (between points 33" and 41") and 45' (between point 41' and 33') of lower level conductors 47' and 49' the same points 33' and 33" that have been shown in FIG. 2e. The sidewalls for lower level conductor 47' have been marked with 51', the sidewalls for lower level conductor 49' have been marked with 53'. The dotted lines that are shown in FIG. 2f are the geometric centers of the upper level conductors that have previously been shown in FIG. 2e, including the dotted section of the Y–Y' axis which is the upper level connector of maximum length 61' if FIG. 2e.

It must further be noted in FIG. 2f that lines of geometric centers of the lower level conductors that are located on both sides of the longest lines 60' and 60" are in pairs of equal length where the members of each pair are located on opposite sides of lines 60' and 60". For instance, the length of line 61' is equal to the length of line 43', the length of line 62' is equal to the length of line 45'. This pattern would continue for a pattern of lines that contains more line than the sample pattern that has been shown in FIGS. 2e and 2f.

FIG. 3 addresses a helix coil inductor of the invention that uses uniform conductor height whereby furthermore ferromagnetic material 42 is incorporated. The construction of the helix coil of the invention that is shown in the FIGS. 3a through 3d is identical to the construction of the helix coil of the invention that has been shown in FIGS. 2a through 2d with the major and significant difference that a ferromagnetic core 42 has been incorporated between the upper and the lower level inductors of the helix coil. The comments and highlighted features that apply to the respective drawings are therefore equally applicable between for instance FIG. 2a and FIG. 3a, FIG. 3b and FIG. 3b, etc. with the notable exception that each of the FIG. 3a through 3d shows the incorporation of the ferromagnetic core 42.

Figure 3A:
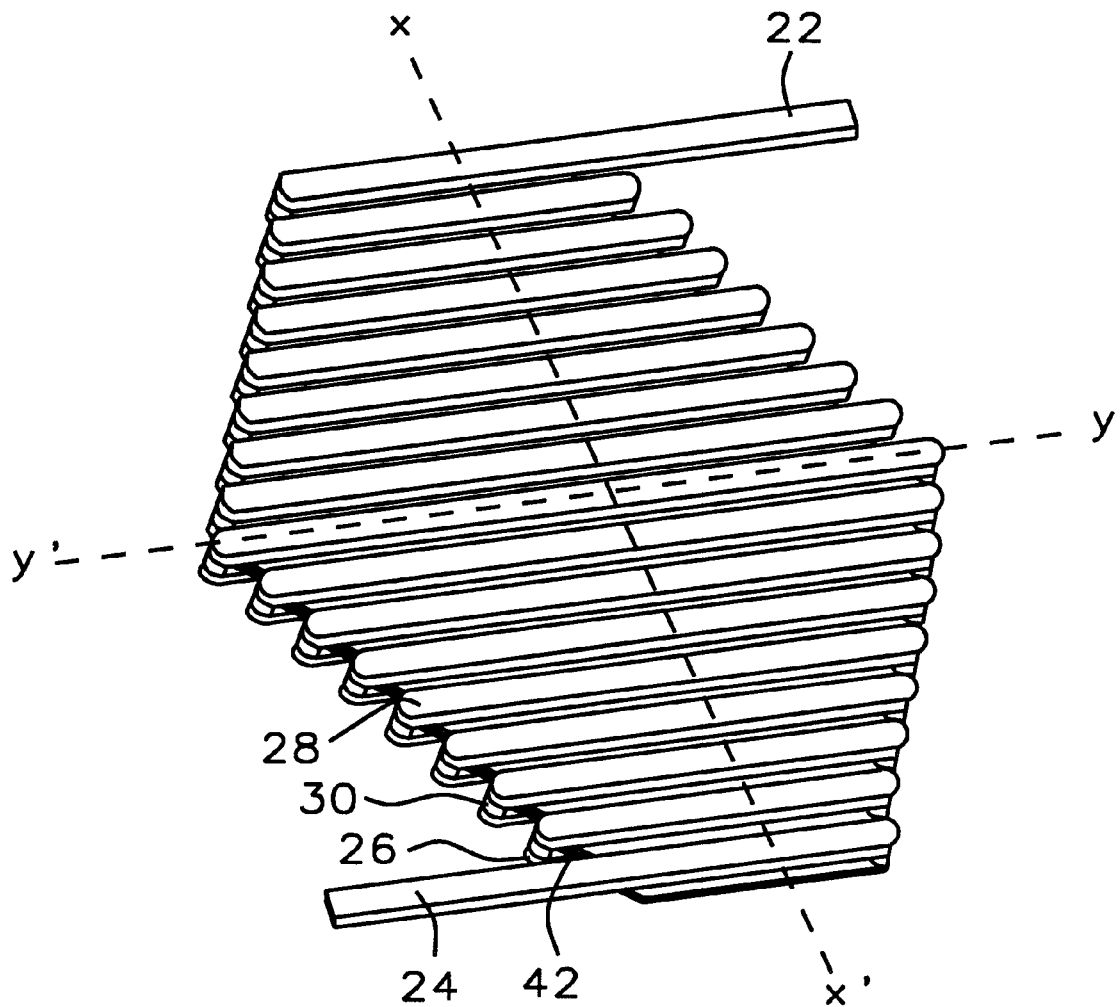
FIG. 3a is an extended three-dimensional view of the helix coil inductor of the invention with a uniform vertical interconnect conductor height whereby ferromagnetic material is incorporated.

FIG. 3a is an extended three-dimensional view of the helix coil inductor of the invention with a uniform conductor height whereby ferromagnetic material 42 is incorporated.

The method to form the helix coil of the invention that has been supplied with ferromagnetic material between the upper and lower level conductors of the coil is as follows. The process of creating the helix coil conductor of the invention uses the following steps. The lower level conductors 26 are first formed, these conductors may be formed on top of a layer of dielectric that has been deposited on the surface of the underlying substrate or they may be formed directly on the surface of the substrate. These lower level conductors 26 are formed under a relatively small angle with the Y–Y' axis, an angel of between about 5 and 30 degrees. After the lower level conductors have been formed, dielectric is deposited over the surface of the lower level of conductors to a height that is the combined value of the height of the vertical interconnects 30 and the thickness of the upper level conductors 28. A layer of ferromagnetic material is next selectively deposited whereby this layer covers the surface of the dielectric layer into which the lower level conductor have been formed while it also covers the surface of the lower level conductors. The ferromagnetic material does not overlay the surface areas for the vertical interconnects that are contained in the upper surface of the lower level connector but is bounded by these geometric centers. After the ferromagnetic material has been deposited, a layer of dielectric is deposited over the layer of ferromagnetic material thereby including the surface areas of the lower level conductors that protrude from the lower regions of the layer of ferromagnetic material. The conventional dual damascene process then allows for the creation of the vertical interconnects 30 at the same time that the upper level of conductors 28 are created. After this dual damascene process has been completed, the now completed helix coil of the invention can be covered with a passivation layer-to protect the coil from environmentally induced damage. In performing the dual damascene process, it must be noted that the input and output connections 22/24 for the helix coil are to be simultaneously created thus providing the means of accessing the helix coil.

Figure 3B:
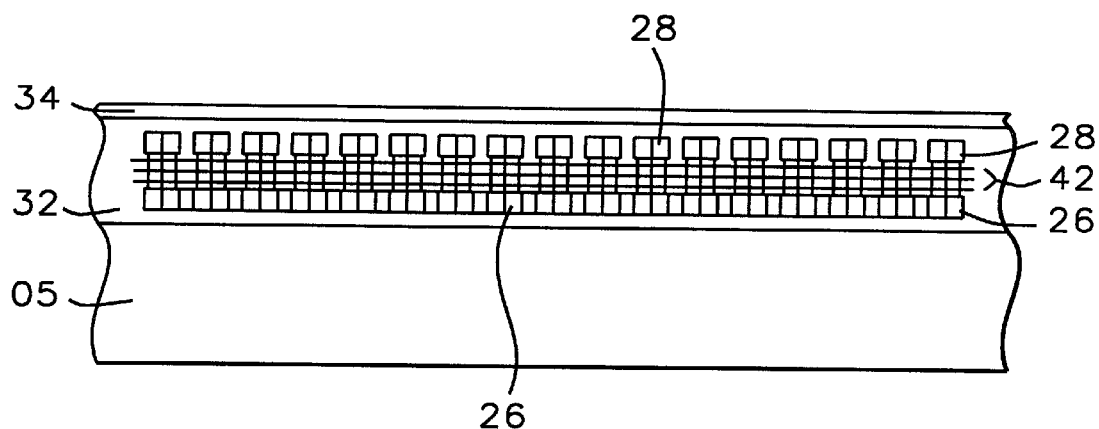
FIG. 3b shows an X–X' cross section of the helix coil inductor of the invention with a uniform vertical interconnect conductor height whereby ferromagnetic material is incorporated.

FIG. 3b shows a X–X' cross section of the helix coil inductor of the invention with a uniform conductor height whereby ferromagnetic material 42 is incorporated.

Figure 3C:
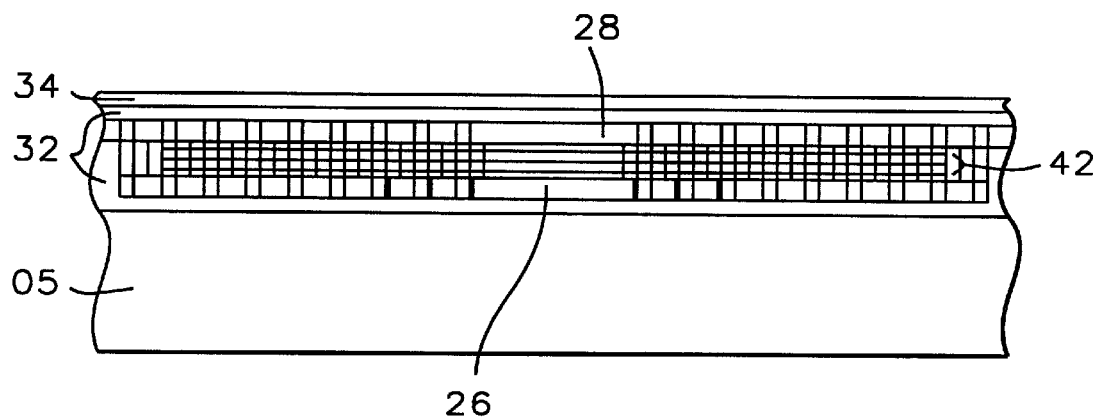
FIG. 3c shows an Y–Y' cross section of the helix coil inductor of the invention with a uniform vertical interconnect conductor height whereby ferromagnetic material is incorporated.
Figure 3D:
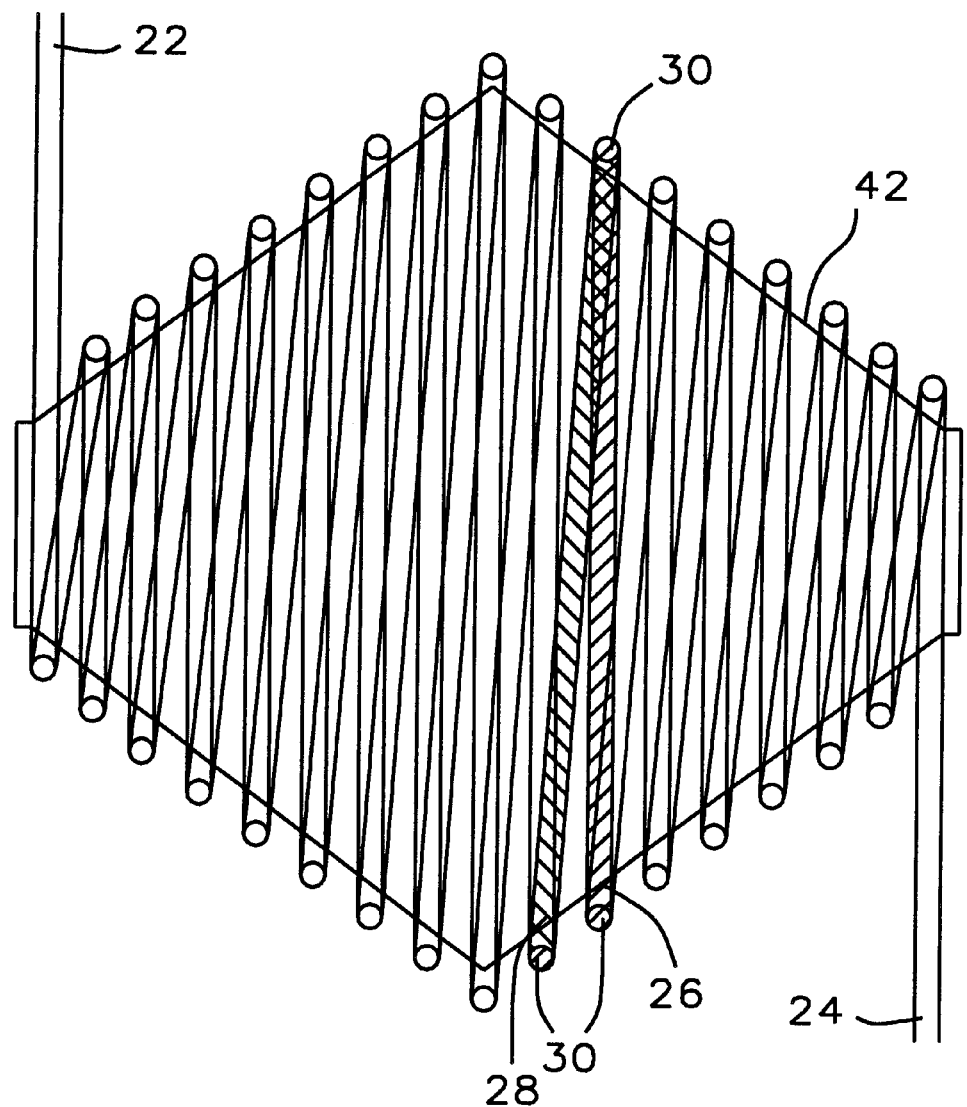
FIG. 3d shows a top view of the helix coil inductor of the invention with a uniform vertical interconnect conductor height whereby ferromagnetic material is incorporated.

FIG. 3c shows a Y–Y' cross section of the helix coil inductor-of the invention with a uniform conductor height whereby ferromagnetic material 42 is incorporated.

Figure 4A:
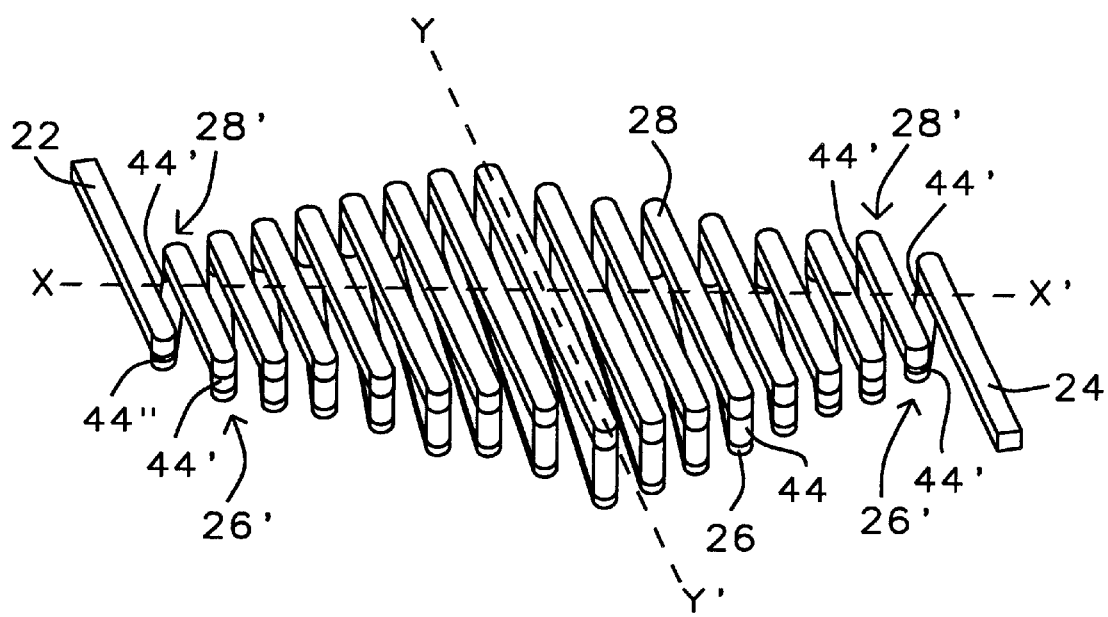
FIG. 4a is an extended three-dimensional view of the helix coil inductor of the invention with a non-uniform vertical interconnect conductor height.

FIG. 4 addresses the third embodiment of the invention, which is a helix coil inductor of the invention that uses vertical interconnects 44 of non-uniform heights. It is in this respect important to reiterate the concepts of upper conductor 28, lower level conductor 26 and vertical interconnect 44 between the upper and the lower level conductor. The main point of interest under the third embodiment of the invention is the length of the vertical interconnection 44 between the lower level (26) and the level upper (28) conductors that form the helix coil of the invention. One such vertical interconnect has been highlighted as interconnect 44 in FIG. 4a. By evaluating the comparative heights of the other vertical interconnects that are shown in FIG. 4a it is clear that the height of these interconnects is not constant but varies between adjacent vertical interconnects when proceeding in the X–X' direction of the helix coil. The lower level inductors of the helix coil are in one plane, the distance between the upper conductors and the lower level conductors (which is the length of the vertical interconnects between the upper and the lower level conductors) varies with a maximum distance being present in the center of the coil where the X–X' and the Y–Y' axis intersect, from which maximum the distance between upper and lower level conductors of the helix coil decreases in equal steps between adjacent conductors of the helix coil when progressing in either direction in the direction of the X–X' axis of the helix coil. This structure of varying distances between adjacent upper and lower level conductors of the helix coil of the invention further concentrates the electromagnetic field of the helix coil around the center of the helix coil whereby the center of the helix coil is located underneath the longest upper level conductor of the helix coil and in the cross section of the helix coil in the Y–Y' direction where the vertical interconnects have a maximum height, whereby the center point is removed from this longest upper conductor by a distance that is equal to half the average height of the vertical interconnects between the upper and the lower level conductors of the helix coil. The height of a vertical interconnect is thereby understood to be the length of a vertical interconnect between the upper surface of the lower level conductor and the lower surface of the upper conductor to which the vertical interconnect is connected.

FIG. 4a is an extended three-dimensional view of the helix coil inductor of the invention with a non-uniform conductor height. The concept of the different heights of the vertical interconnects between the upper and the lower level conductors of the helix coil of the invention is clear from this expanded view that is shown in FIG. 4a.

The method of forming the helix coil of the invention that has a non-uniform height in a direction that is perpendicular to the surface of the underlying substrate is as follows. The process of creating the helix coil conductor of the invention uses the following steps. The lower level conductors 26 are first formed, these conductors may be formed on top of a layer of dielectric that has been deposited on the surface of the underlying substrate or they may be formed directly on the surface of the substrate. These lower level conductors 26 are formed under a relatively small angle with the Y–Y' axis, an angel of between about 5 and 30 degrees. After the lower level conductors have been formed, the balance of the process for forming the helix coil that is shown in FIG. 4a proceeds in incremental steps where each of the steps is controlled by the height of the respective vertical interconnects that must be implemented. It must in this be remembered that an inductor is created with as objective to establish certain electrical performance parameters for the coil. From this it immediately follows that the physical design parameters for the coil are determined by the expected electrical parameters of the coil. These physical design parameters are many, one of the key parameters for the coil that is shown in FIG. 4a and that is of interest at this point is the height of the vertical interconnects that connect the lower level conductors with the upper level conductors. By way of example a set of two upper and lower level conductors highlighted with 26' (for the two lower level conductors), 28' (for the two upper level conductors) and the thereby belonging vertical interconnect 44' have been highlighted. Some observations are relating to these two sets of conductors are in order.

1) the lower level conductors 26' are at this stage of the process of creating the helix coil in place
2) all four vertical interconnect 44' are of equal height
3) the two upper level conductors 28' are of equal length, and equal thickness, and
4) all other physical design parameters such as conductor width, material used for the conductor are the same for the two upper level conductors 28'.

From this it becomes clear that the above indicated steps of creating the coil of the invention that is shown in FIG. 4a requires a repeat cycle whereby, during each cycle, a set of vertical interconnects together with the connecting upper level conductors is being created. It is not unreasonable to suggest that there are N different values for the height Hv is the vertical interconnects whereby the value of Hv incrementally increases from a minimum value (at the extremities of the coil in the direction of the X–X' axis) to a maximum value (at the point where the coil intersects with the Y–Y' axis). If it is assumed that Hvmin=Hv1 is the lowest value of the height of the respective vertical interconnects and Hvmax then the first step after the completion of the lower level conductors is to deposit a first layer of dielectric over the lower level of conductors, this layer of dielectric having a thickness that equals the sum of Hvmin plus the required thickness of the upper level of conductors. Before the upper level of conductors and the therewith connected vertical interconnects can be created, input and output connections 22 an 24 must be created. For this purpose a first layer of dielectric is deposited which has a thickness that is equal to the vertical interconnect 44" (that is used to connect the I/O connectors to the coil) plus the thickness of an upper level conductor. After this first layer of dielectric has been deposited, the dual damascene procedure allows for the simultaneous creation of the vertical interconnects 44" (two in number) and I/O conductors 22 and 24 (two in number). After the I/O connects 22/24 have been created, the upper level conductors and the thereby belonging vertical interconnects can be created again using the dual damascene process. A second layer of dielectric is deposited over the surface of the first layer of dielectric, the thickness of this second layer of dielectric is equal to the sum of the interconnects 44' and the thickness of the upper level conductor. The dual damascene process now allows for the creation of the vertical interconnects 44' (four in number) and the upper level conductors 28' (two in number). These processing steps of depositing a layer of dielectric (with a thickness that is equal to the combined value of the height of the vertical interconnect that is to be contained in this layer of the dielectric plus the thickness of the upper level connector that connects the two to be created vertical interconnects) followed by the dual damascene step of etching the vertical interconnect and the connecting upper level conductor are repeated. With the dual damascene step that has been indicated herein it is assumed that as part of this step metal is deposited to fill the created openings and that this deposited layer of metal may optionally be planarized. By repeating these processing steps the point is reached where the last upper level conductor must be created. This in essence uses the same procedures that have been applied for the creation of the preceding upper level conductors with the exception that only two vertical interconnects are created with one thereby belonging upper level conductor, this in accordance with the coil that is shown in FIG. 4a. There is no reason to assume that the process of the invention must end with only one longest upper level conductor, it is perfectly feasible to have for instance three or any other number of upper level conductors that are of one maximum length.

After the last dual damascene process has been completed, the now completed helix coil of the invention can be covered with a passivation layer to protect the coil from environmentally induced damage.

Figure 4B:
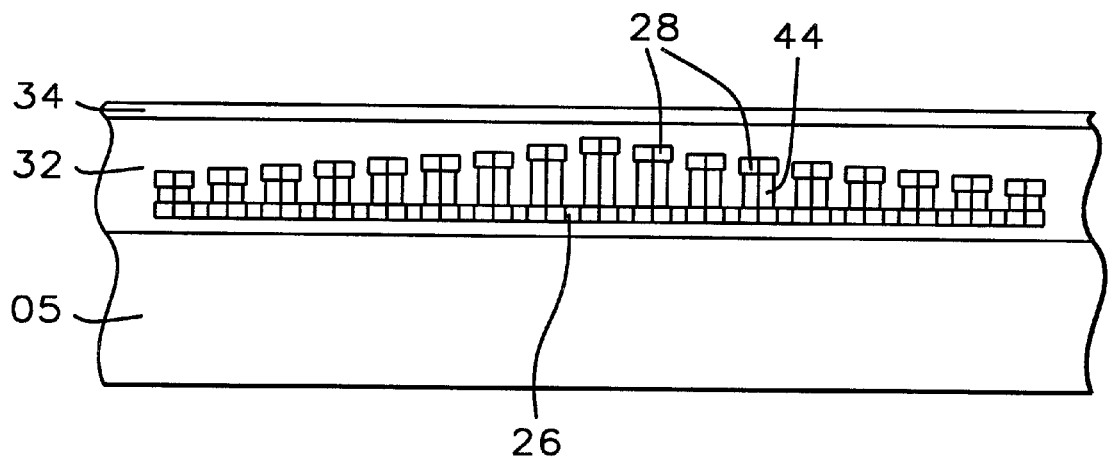
FIG. 4b shows an X–X' cross section of the helix coil inductor of the invention with a non-uniform vertical interconnect conductor height.

FIG. 4b shows an X–X' cross section of the helix coil inductor of the invention with a non-uniform conductor height. The cross section that is shown in FIG. 4b shows very clearly the variation in the height of the vertical interconnects between the upper and the lower level conductors that form the helix coil of the invention. The vertical interconnect that is highlighted with 44 is representative of the vertical interconnects of the helix coil, adjacent to vertical interconnect 44 are interconnects that are of non-uniform heights.

Figure 4C:
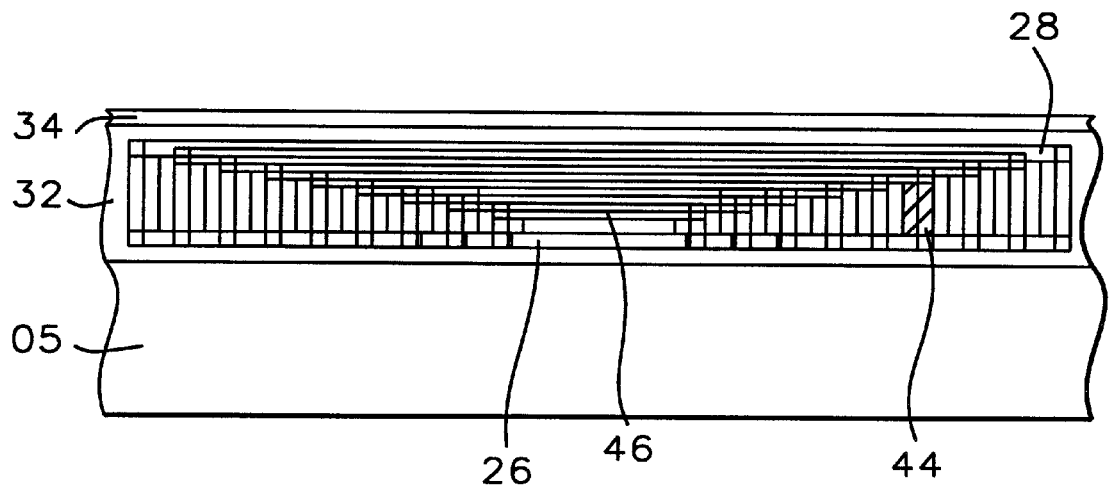
FIG. 4c shows an Y–Y' cross section of the helix coil inductor of the invention with a non-uniform vertical interconnect conductor height.

FIG. 4c shows an Y–Y' cross section of the helix coil inductor of the invention with a non-uniform conductor height.

FIG. 4c shows the varying lengths of the upper level conductors 46 that are part of the body of the helix coil of the invention. Where the upper level conductor is labeled 46, this label is meant to represent any and all of the upper level conductors of the helix coil.

Figure 5A:
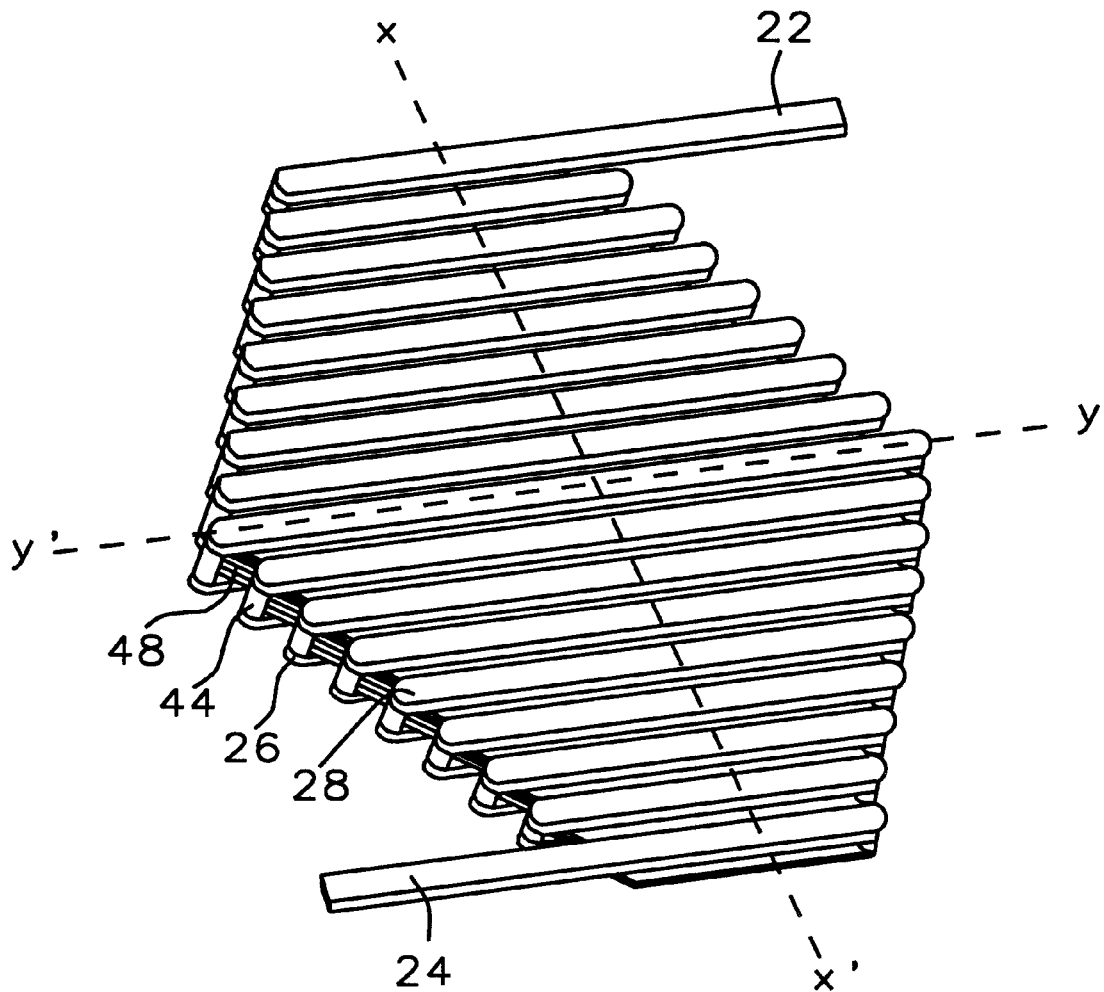
FIG. 5a is an extended three-dimensional view of the helix coil inductor of the invention with a non-uniform vertical interconnect conductor height whereby ferromagnetic material is incorporated.
Figure 5B:
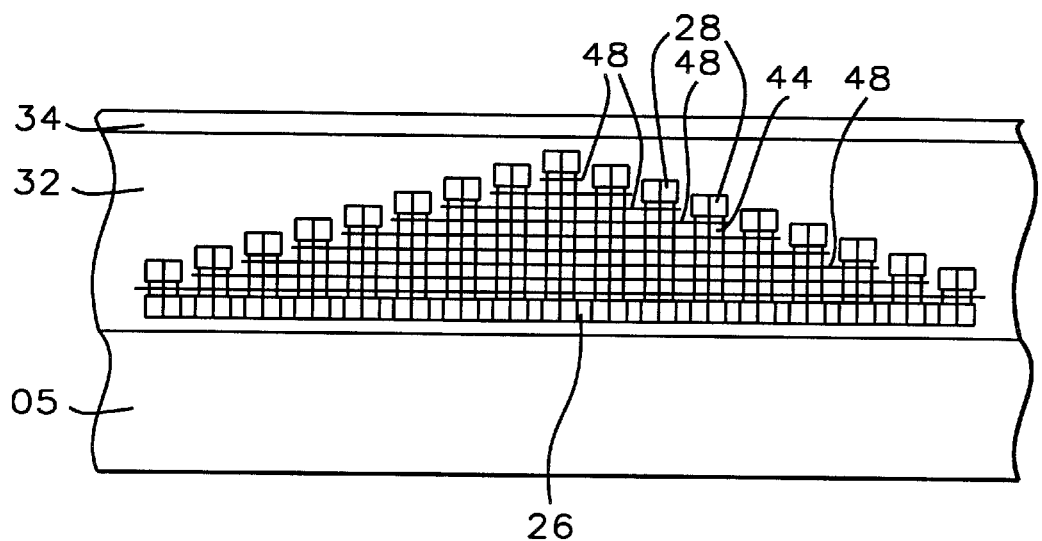
FIG. 5b shows an X–X' cross section of the helix coil inductor of the invention with a non-uniform vertical interconnect conductor height whereby ferromagnetic material is incorporated.
Figure 5C:
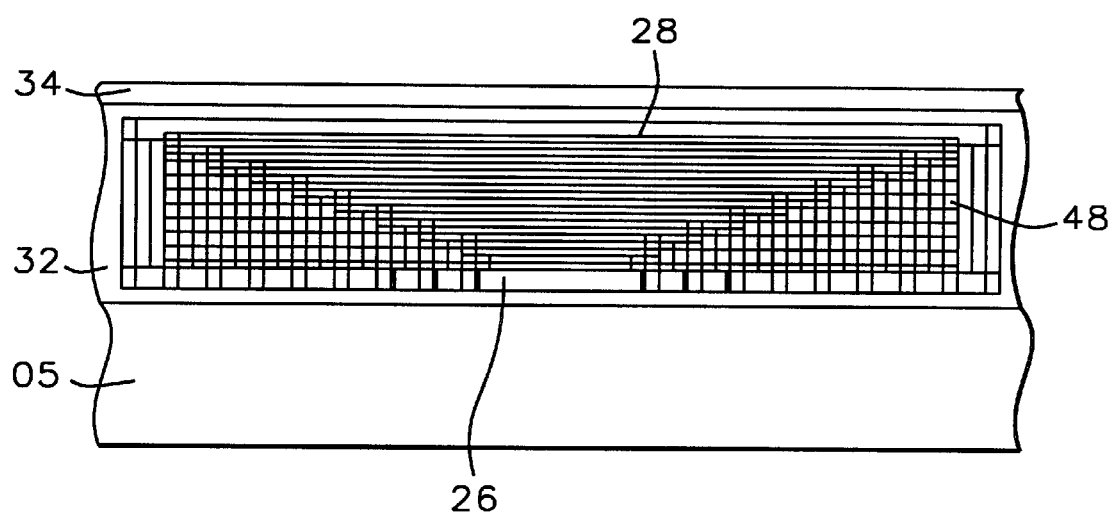
FIG. 5c shows an Y–Y' cross section of the helix coil inductor of the invention with a non-uniform vertical interconnect conductor height whereby ferromagnetic material is incorporated.

FIGS. 5a through 5c present the fourth embodiment of the invention and show the helix coil of the invention that is identical to the helix coil of the third embodiment of the invention (as shown in FIGS. 4a through 4c) with the exception that a ferromagnetic core 48 has been incorporated into the helix of the invention. This ferromagnetic core 48 is interposed between the upper and the lower level conductors of the helix core.

FIG. 5a is an extended three-dimensional view of the helix coil inductor of the invention with a non-uniform conductor height whereby ferromagnetic material 48 is incorporated.

The processing steps that are required to create the structure of the coil as it shown in FIG. 5a combines that process of first depositing a layer of ferromagnetic material, as it must be done for the creation of the coil that is shown in FIG. 3a, after which the various heights of vertical interconnects and the upper level conductors that connect these vertical interconnects is performed as has previously been described in detail under FIG. 4a above.

FIG. 5b shows an X–X' cross section of the helix coil inductor of the invention with a non-uniform conductor height whereby ferromagnetic material 48 is incorporated.

FIG. 5c shows an Y–Y' cross section of the helix coil inductor of the invention with a non-uniform conductor height whereby ferromagnetic material 48 is incorporated.

Figure 6:
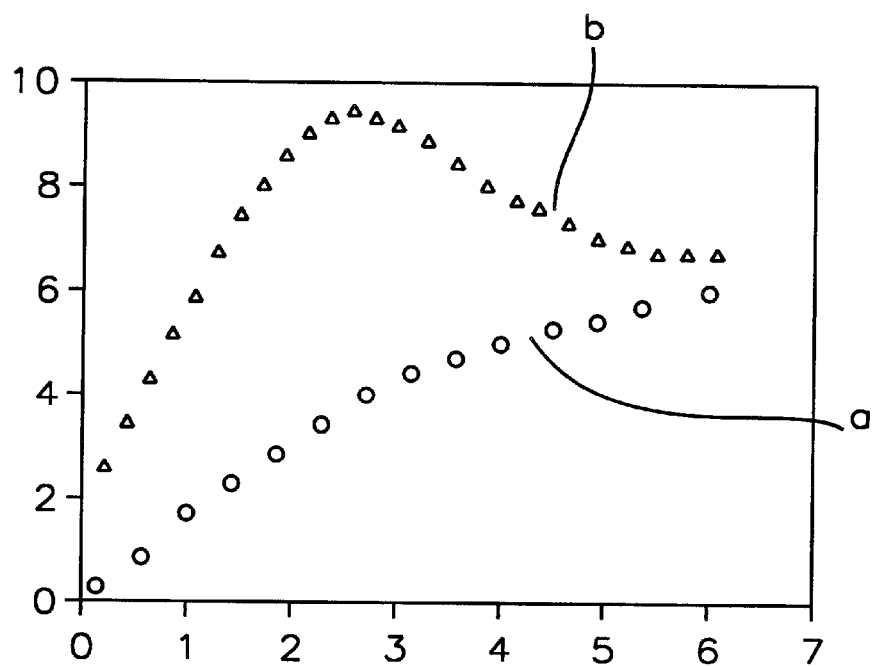
FIG. 6 shows a graphic depiction of the Q factor as a function of frequency for a conventional spiral inductor and for the helix coil inductor of the invention.

FIG. 6 shows a graphic depiction of the Q factor as a function of frequency for a conventional spiral inductor and for the helix coil inductor of the invention. The frequency of application of the inductor is plotted (in GHz) along the horizontal axis of the graph, the Q factor of the inductor is plotted along the vertical axis (in units of quality factor). Curve a depicts the relation between Q and the frequency of application for the conventional spiral inductor while curve b depicts the relation between Q and the frequency of application for the helix coil inductor of the first embodiment of the invention. The advantage gained by the helix coil of the invention is clear, the Q factor of the helix coil of the invention only starts to decrease after an operational frequency of 3 GHz has been reached.

Figure 7:
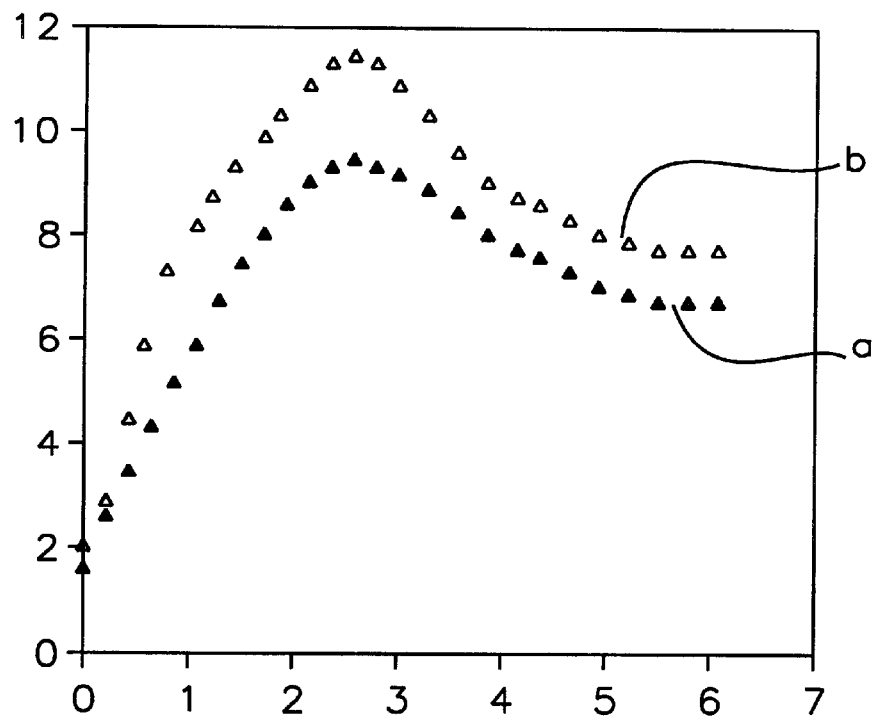
FIG. 7 shows a graphic depiction of the Q factor as a function of frequency for the spiral inductor of the invention with and without the incorporation of ferromagnetic material in the helix coil inductor.

FIG. 7 shows a graphic depiction of the Q factor as a function of frequency for the helix coil inductor of the invention and for the helix coil inductor of the invention to which a ferromagnetic core has been added. The frequency of application of the inductor is plotted (in GHz) along the horizontal axis of the graph, the Q factor of the inductor is plotted along the vertical axis (in units of quality factor). Curve "a" depicts the relation between Q and the frequency of application for the helix coil inductor of the invention while curve "b" depicts the relation between Q and the frequency of application for the helix coil inductor of the invention to which a ferromagnetic core has been added. The advantage gained by the addition of ferromagnetic core to the helix coil of the invention is clear, the Q factor of the helix coil of the invention only starts to decrease after an operational frequency of 3 GHz has been reached.

The following data further quantify the results that have been summarized by the graphs that are shown in FIGS. 6 and 7.

|     | #1     | #2    | #3         |
|-----|--------|-------|------------|
| #1  | 1.0    | 1.0   | 1.0 um     |
| #2  | 1.0    | 1.0   | 1.0 um     |
| #3  | 10.0   | 4.0   | 4.0 um     |
| #4  | 2.0    | 1.0   | 1.0 um     |
| #5  | 50.0   | 200   | 200 um     |
| #6  | 1520   | 4000  | 4000 um    |
| #7  | 21,868 | 9,500 | 9,500 um$^2$ |
| #8  | 3.48   | 10.70 | 14.84 nH   |
| #9  | 1.80   | 6.10  | 7.64       |
| #10 | 3.70   | 8.47  | 10.68      |
| #11 | 5.00   | 9.30  | 10.87      |
| #12 |        | 207%  | 326%       |
| #13 |        | 238%  | 324%       |
| #14 |        | 129%  | 188%       |
| #15 |        | 86%   | 98%        |
| #16 |        | 57%   | 57%        | wherein:
  column #1 represents the conventional spiral inductor
  column #2 represents the helix coil inductor of the invention of uniform height without ferromagnetic core
  column #3 represents the helix coil inductor of the invention of uniform height with ferromagnetic core, while:
    row #1 represents metal 1 thickness
    row #2 represents metal 2 thickness
    row #3 represents conductor width
    row #4 represents conductor spacing
    row #5 represents the smaller (par. 22, FIG. 1) inner conductor length
    row #6 represents total conductor length
    row #7 represents total chip surface area
    row #8 represents inductance value
    row #9 represents Q value at 1 GHz
    row #10 represents Q value at 2 GHz
    row #11 represents Q value at 3 GHz
    row #12 represents the percentile improvement in inductive value when compared with the conventional spiral-inductor
    row #13 represents the percentile improvement in Q value at 1 GHz when compared with the conventional spiral inductor
    row #14 represents the percentile improvement in Q value at 2 GHz when compared with the conventional spiral inductor
    row #15 represents the percentile improvement in Q value at 3 GHz when compared with the conventional spiral inductor
    row #16 represents the reduction in total chip area required when compared with the conventional spiral inductor.

It is clear from the above indicated data that the improvements that are obtained by the helix coil inductor of the invention are not only obvious but also very significant.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creating a helix coil inductor having a body, said body being created over a surface of a silicon substrate having a plane, said surface of said silicon substrate having X and Y coordinates with corresponding X and Y axis perpendicularly intercepting, said point of intercept of said X and Y axis being an arbitrary point on a surface of said substrate, said helix coil having an axis having a direction, said direction of said axis being parallel with said surface of said substrate, comprising:

creating a multiplicity of N−1 lower level inductors, said N−1 lower level conductors being located in a plane parallel with a plane of a surface of said silicon substrate; and creating a multiplicity of 2N vertical interconnects having a circular cross section, said 2N vertical interconnects having a radius located in a plane perpendicular with said plane of said surface of said silicon substrate, simultaneously creating a multiplicity of N upper level inductors located in a plane parallel with said plane of said surface of said silicon substrate, upper level connectors being separated from lower level conductors by a distance.

2. The method of claim 1, said creating a multiplicity of N−1 lower level conductors comprising steps of:

depositing a first layer of dielectric over said surface of said substrate, said first layer of dielectric having a thickness;

depositing a second layer of intra-metal dielectric over said first layer of dielectric, said second layer of intra-metal dielectric having a surface;

patterning and etching said second layer of intra-metal dielectric, creating trenches for said multiplicity of lower level conductors;

filling said trenches for said multiplicity of lower level conductors with a first level of metal; and planarizing said first level of metal down to the surface of said second layer of intra-metal dielectric, creating said multiplicity of lower level conductors.

3. The method of claim 1, said lower level conductors comprising:

a lower level conductor width in a plane parallel with said plane of said surface of said silicon substrate;

a lower level conductor length in a plane parallel with said plane of said surface of said silicon substrate;

a lower level conductor height in a plane perpendicular to said plane of said surface of said silicon substrate;

lower level conductor lengthwise sidewalls being vertical sidewalls in a plane perpendicular to said plane of said surface of said silicon substrate in a direction of the length of said lower level conductor;

lower level conductor widthwise sidewalls being vertical sidewalls in a plane perpendicular to said plane of said surface of said silicon substrate in a direction of the width of said conductor, said vertical sidewalls having contours of a semi-cylinder;

a lower level conductor upper surface being an upper surface in a plane parallel with said plane of said surface of said silicon substrate, said lower level conductor upper surface comprising lower level conductor interconnect surface areas being two interconnect surface areas located at both extremities of length of said lower level conductor upper surface each of said interconnect surface areas being bounded on one side by said lower level conductor widthwise sidewall;

a lower level conductor lower surface being a lower surface in a plane parallel with said plane of said surface of said silicon substrate; and a lower level conductor center line center line, said lower level conductor center line being located in a middle between said lengthwise sidewalls in a direction of said lengthwise sidewalls, said center line furthermore being located in said lower level conductor upper surface, endpoints for said center lower level conductor center line being removed from said widthwise sidewalls by a distance equal to said radius of said cross section of said vertical interconnect conductors.

4. The method of claim 3, said lower level conductor upper surface comprising two interconnect surface areas having a surface area being a circle having a radius, further having a center, a center of said circle being said center of said lower level conductor interconnect surface area, said center being located on and as end-points of said lower level conductor center line at a distance from said widthwise sidewalls of said lower level conductors equal to said radius of said circle forming said interconnect conductor surface areas.

5. The method of claim 1, creating a multiplicity of 2N vertical interconnects located in a plane perpendicular with a plane of a surface of said silicon substrate while simultaneously creating a multiplicity of N upper level inductors located in a plane parallel with said plane of a surface of said silicon substrate, said upper level connectors being separated from said lower level conductors by a distance, comprising steps of:

depositing a third layer of intra-metal dielectric having a surface containing one or more layers of intra-level dielectric over said second layer of intra-level dielectric, including the surface of said multiplicity of lower level conductors;

patterning and etching third layer of intra-metal dielectric, creating dual damascene structures, vias of said dual damascene structure being said vertical interconnect conductors aligning with said lower level conductor interconnect surface areas, dual damascene trenches being said upper level conductors;

depositing a second layer of metal over said third layer of intra-level dielectric, including said vias created in said third layer of intra-metal dielectric; and planarizing said second layer of metal down to the surface of said third layer of intra-metal dielectric.

6. The method of claim 5, said vertical interconnects comprising:

a vertical interconnect height;

a top surface in a plane being parallel with said plane of said substrate and removed from said substrate by a distance equal to said height of said vertical interconnect; and a vertical interconnect cross section being a circular cross section having a center, said center being formed by a line interconnecting two or more centers of two or more of said circular cross sections.

7. The method of claim 5, said upper level conductors comprising:

an upper level conductor width being a width in a plane parallel with said plane of said surface of said silicon substrate;

an upper level conductor length being a length in a plane parallel with said plane of said surface of said silicon substrate;

a upper level conductor height being a height in a plane perpendicular to said plane of said surface of said silicon substrate;

upper level conductor lengthwise sidewalls being vertical sidewalls in a plane perpendicular to said plane of said surface of said silicon substrate in a direction of the length of said upper level conductor;

upper level conductor widthwise sidewalls being vertical sidewalls in a plane perpendicular to said plane of said surface of said silicon substrate in a direction of the width of said conductor, said vertical sidewalls having contours of a semi-circle;

an upper level conductor lower surface being a lower surface in a plane parallel with said plane of said surface of said silicon substrate, said upper level conductor lower surface comprising two interconnect surface areas located at both extremities of length of said upper level conductor lower surface such that each of said interconnect surface areas is bounded on one side by upper level conductor interconnect surface areas being said upper level conductor widthwise sidewall;

an upper level conductor upper surface being an upper surface in a plane parallel with said plane of said surface of said silicon substrate; and upper level conductor center line being a center line located in a middle between said lengthwise sidewalls in a direction of said lengthwise sidewalls, furthermore being located in said upper level conductor lower surface, endpoints for said center line being removed from said widthwise sidewalls by a distance equal to said radius of said cross section of said vertical interconnect conductors.

8. The method of claim 7, said upper level conductor interconnect surface areas having a surface area being a circle having a radius, further having a center, the center of said circle being said center of said upper level conductor interconnect surface area, said center being located on and as end-points to said upper level conductor center line at a distance from said widthwise sidewalls of said upper level conductors equal to said radius of said circle being said interconnect surface areas.

9. The method of claim 1, said helix coil inductor being created overlying helix coil X and Y coordinates, corresponding helix coil X axis and Y axis perpendicularly intercepting, said helix coil point of interception of said helix coil X and Y axis being an arbitrary point on a surface of said substrate, said helix coil further comprising:

a helix coil length being a length in a plane parallel with said plane of said surface of said silicon substrate measured in a direction of said X coordinate;

a helix coil width being a width in a plane parallel with said plane of said surface of said silicon substrate measured in a direction of said Y coordinate; and a helix coil height being a height in a plane perpendicular to said plane of said surface of said silicon substrate.

10. The method of claim 1, said substrate point of intercept coinciding with said helix coil point of intercept, said helix coil point of intercept being selected on said surface of said substrate as a location where said helix coil inductor is created, implying a fixed orientation of said helix coil X axis and Y axis.

11. The method of claim 1, said 2N upper level conductors comprising:

a maximum length upper level conductor being a conductor created in equal lengths in a direction of said Y and said Y' axis of said helix coil coordinates being of an upper level conductor length longer than all other conductors contained within said upper level conductors; and a multiplicity of 2N−1 conductors created parallel with said maximum length upper level conductor, located in equal numbers on both sides of said maximum length upper level conductor, the length of said multiplicity of conductors being created in equal lengths in the Y and the Y' direction of said helix coil coordinates, furthermore the length of said multiplicity of conductors uniformly decreasing with increasing distance between said maximum length upper level conductor and each of said multiplicity of conductors.

12. The method of claim 11, said centers of said interconnect surface areas of said lower surface of said maximum length upper level conductor being located on said Y–Y' axis of said helix coil coordinates at equal distances from said intersect of said helix coil coordinates at point +Y maximum upper for a first center and −Y maximum upper for a second center.

13. The method of claim 1, said N−1 lower level inductors comprising:

a first and a second lower level conductor extending from points of intercept of their upper surface lengthwise center with said X–X' axis of said helix coil coordinates, said points of intercept being located equidistant from the point of intercept of the X–X' and Y–Y' axis of said helix coil coordinates, said lengthwise centers of said upper surfaces of said lower conductors intercepting under an angle with the Y–Y' direction of said helix coil coordinates, furthermore said first and second lower level conductor are of a maximum length lower level conductors being lower level conductor lengths being longer than all other lower level conductors contained within said multiplicity of lower level conductors, furthermore a first center of said interconnect surface area of said first maximum length lower level conductor coinciding with said point +Y maximum upper, leaving a second center of said interconnect surface area of said first maximum length lower level conductor available, a first center of said interconnect surface areas of said second maximum length lower level conductor coinciding with said point −Y max. upper, leaving a second center of said interconnect surface areas of said second maximum length lower level conductor available; and a multiplicity of 2N−3 conductors located in equal numbers on both sides of said maximum length lower level conductors, extending from a point of intercept of said centers of said lower level conductors with said X–X' axis of said helix coil coordinates, furthermore the length of said multiplicity of lower level conductors uniformly decreasing with increasing distance with said maximum length lower level conductors.

14. The method of claim 1, said upper level conductors and said lower level conductors being joined by means of said vertical interconnects such that:

a first and second vertical interconnect being provided to said maximum length upper level conductor overlying said first and second center of said interconnect surface areas of said lower surface of said maximum length upper level conductor, said vertical interconnects facing towards said upper surface of said lower level conductor, said center of said first vertical interconnect coinciding with said first center of said interconnect surface area of said first maximum length lower level conductor, said center of said second vertical interconnect coinciding with said first center of said interconnect surface area of said second maximum length lower level conductor, leaving a second center of said interconnect surface areas available on each of said first and second maximum length lower level conductors;

interconnecting in descending order of upper level and lower level conductor length and starting with connecting an upper level conductor to said available second center of said interconnect surface areas on each of said first and second maximum length lower level conductors, leaving available a center of said interconnect surface of said lower level conductors, said interconnecting aligning one center of said interconnect surface of said lower level conductors with one center of said interconnect surface of said upper level conductors in descending order of upper level and lower level conductor length, said procedure of connecting upper level conductors to lower level conductors continuing to where all N upper level and N−1 lower conductors of said helix coil have been interconnected, creating a helix conductor structure being symmetrical with said Y−Y' axis as the center of said symmetry.

15. The method of claim 14, two additional lower level conductors of equal length with a length being shorter when compared with all other lower level conductors being reserved for input/output connections with said helix coil, said input output connection being established by providing a vertical interconnect conductor to said remaining available centers of said interconnect areas of said upper surface of said additional lower level conductor, further providing two upper level conductors of extended length aligning with said provided vertical interconnect conductors.

16. The method of claim 1, said helix coil being embedded in a dielectric and furthermore being covered by a layer of passivation.

17. The method of claim 2, said depositing a first layer of dielectric over said surface of said substrate said first layer of dielectric having a thickness being eliminated, depositing said second layer of intra-metal dielectric on said surface of said substrate.

* * * * *